United States Patent [19]

Ito et al.

[11] Patent Number: 4,833,520

[45] Date of Patent: May 23, 1989

[54] SEMICONDUCTOR INTEGRATED CIRCUIT HAVING WIRINGS FOR POWER SUPPLY SUITED FOR COMPUTER-AIDED-DESIGN

[75] Inventors: Soichi Ito; Yoshihiro Mabuchi, both of Tokyo, Japan

[73] Assignee: NEC Corporation, Japan

[21] Appl. No.: 6,502

[22] Filed: Jan. 21, 1987

[30] Foreign Application Priority Data

Jan. 22, 1986 [JP] Japan ................................. 61-12376

[51] Int. Cl.⁴ ...................... H01L 23/48; H01L 27/10
[52] U.S. Cl. ........................................ 357/68; 357/45; 357/71
[58] Field of Search ......................... 357/68, 70, 45, 71

[56] References Cited

U.S. PATENT DOCUMENTS

| | | | |
|---|---|---|---|
| 3,999,214 | 12/1976 | Cass | 357/68 |
| 4,006,492 | 2/1927 | Eichelberger et al. | 357/68 |
| 4,136,356 | 1/1979 | Kusano | 357/70 |
| 4,568,961 | 2/1986 | Noto | 357/68 |

FOREIGN PATENT DOCUMENTS 0167365  1/1986  European Pat. Off. .............. 357/45

OTHER PUBLICATIONS

IEEE Journal of Solid-State Circuits, vol. SC-14, No. 2, Apr. 1979, p. 255, Peter W. Cook.

Primary Examiner—Andrew J. James
Assistant Examiner—Gregory A. Key
Attorney, Agent, or Firm—Laff, Whitesel, Conte & Saret

[57] ABSTRACT

A semiconductor integrated circuit of standard-cell type or gate-array type includes a plurality of first cells arranged in a plurality of parallel lines, the first cells having first wirings for supplying power, the first wirings being extended over a plurality of the first cells arranged in the same line in a direction of the same line of the first cells, a second cell disposed in the neighbourhood of some of the first cells and having a dimension larger than the first cells, said second cell having second wirings on a periphery thereof to surround circuit portion of the second cell and means for connecting the second wirings with the first wirings in the first cells in the neighbourhood of the second cell.

6 Claims, 2 Drawing Sheets

SEMICONDUCTOR INTEGRATED CIRCUIT HAVING WIRINGS FOR POWER SUPPLY SUITED FOR COMPUTER-AIDED-DESIGN

BACKGROUND OF THE INVENTION

1. Field of the Invention

The present invention relates to a semiconductor integrated circuits (hereinafter, referred to IC's) suited for computer-aided-design, and more particularly to standard-cell type IC's using poly-cells having improved wiring structure for supplying power.

2. Description of the Related Art

As semi-custom LSI's (Large Scale Integrated circuits) designed in accordance with the customer's specification, the standard-cell type IC's using polycells have been widely used. They are designed by a technique similar to the gate-array type semiconductor integrated circuits (hereinafter, simply referred to the gate-array IC's). In the gate-array process, a plurality of blocks of circuit elements and limited number of wirings are preliminarily formed on a semiconductor chip. An electrical circuit in accordance with the customer's specification is then formed by designing a wiring pattern. The wiring pattern to be designed in the later process include wirings for forming a cell of circuit with the circuit elements in each block, wirings for connecting the cells and wirings for supplying power.

On the other hand, the standard-cell type IC using polycells, the blocks of circuit elements are used in software program for designing an IC. The wirings for forming the polycells of circuit with the circuit elements and for connecting the polycells are also designed by computer-aided-design. All the masks for producing the standard-cell type IC is designed by the computer-aided-design.

In the standard-cell type IC, a plurality of polycells are arranged in lines. The polycells have the same or the substantially same width in a direction perpendicular to the line and arbitrary length in a direction in parallel with the line. The polycells are made of various standardized blocks of circuit elements. The standard-cell type IC's are designed by combining the polycells formed by the standarized blocks. The use of the standardized blocks makes the computer-aided-design of IC easy, resulted in an improvement of design efficiency.

Turning to the design of wirings for power supply, they are designed so as to traverse the polycells and to reach predetermined positions on opposing sides facing the neighbouring polycells. If all the polycells have the same width, the wirings for power supply automatically contact with those in the neighbouring polycells. The cells to be formed in a semiconductor chip, however, may have different dimensions. Cells for specific functions such as RAM (Random Access Memory), ROM (Read-Only Memory), microprocessor, peripheral controller of the microprocessor and PLA (Programable Logic Array) may be included as megacells which have a dimension much larger than the polycells. If the wirings for power supply in the megacells are similarly designed to the polycells, the wirings for power supply differ in position between neighbouring polycell and megacell at their sides facing to each other. Thus, disconnection occurs at contacting sides of those cells having different dimensions.

In the prior art, such disconnection was cured by manual correction of wiring pattern. The manual correction split the production efficiency of the computer-aided-design to raise the production cost and to prolong the production period of term.

SUMMARY OF THE INVENTION

It is therefore, a major object to provide a semi-conductor integrated circuit having a structure of wirings for power supply suited for a computer-aided-design and avoiding the possibility of disconnection between cells having different dimensions.

According to the present invention, there is provided a semiconductor integrated circuit comprising a semiconductor chip; a plurality of first cells of partial circuit formed on the semiconductor chip and arranged in a plurality of lines, the first cells having the substantially same width in perpendicular to the lines and arbitrary lengths in parallel to the lines, the first cells having a first wirings for supplying power to the partial circuit, the first wirings being extended over a plurality of the first cells arranged in the same line in a direction of said same line; a second cell of another partial circuit formed on the semiconductor chip and arranged in neighbouring with some of the first cells, the second cell having a width larger than the width of the first cells and a length and having second wirings for supplying power to the other partial circuit, the second wirings being disposed on periphery of the second cell to surround the other partial circuit and connected with the first wirings in the first cells in the neighbourhood of the second cell; and means for connecting the second wiring with the first wirings in the first cells in the neighbouring of the second cell.

The IC of the present invention has the second wirings for power supply on periphery of the second cells having a width larger than the neighbouring first cells. The first wiring for power supply, therefore, can be connected with the second wiring by prolonging straight. This connection may be easily achieved by the computeraided-design technique which requires only modification of the data for the second wiring pattern of the second cell. Any manual correction of wiring pattern is not required. Thus, an efficiency in designing IC is greatly improved with a slight change of wiring pattern.

BRIEF DESCRIPTION OF THE DRAWINGS

The above and other objects, features and advantages of the present invention will become more apparent from the following description taken in conjunction with the accompanying drawings, in which.

Figure 1:
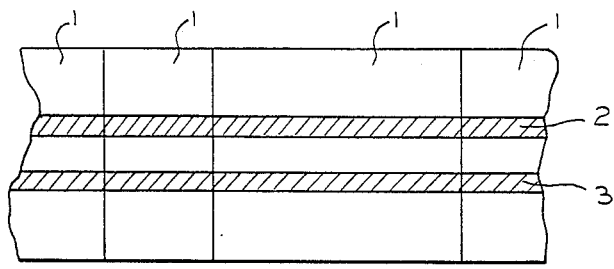
FIG. 1 is a schematic view for explaining the wirings for power supply of the standard-cell type IC in the prior art.

The wirings for supplying power on polycells arranged in a line in the prior art of a standard-cell type IC is shown in FIG. 1. The polycells 1 have the substantially same width or height and arbitrary length determined by functions such as an inverter, an AND gate, an OR gate and a flip-flop. A plurality of polycells are arranged in a line to form a stripe having the substantially uniform width. Wirings 2 and 3 are programed in a software for designing a standard-cell type IC so as to run predetermined levels in a direction of the width. Therefore, the wirings 2 and 3 are automatically connected between the neighbouring polycells 1 by arranging polycells in a line.

When a megacell having a large dimension and then a large width are combined with the polycells 1, wirings for the power supply between neighbouring polycell and the megacell cannot be connected with each other by the computer-aided-design which is programed so that wiring for the power supply may run on predetermined levels in the width. For avoiding such disconnection of the wirings, a complicated software program for the computer-aided-design or a manual correction of the wirings is required. It is difficult to make such software program commonly applicable to the standard-cell type IC including the megacell having arbitrary dimension. The manual correction of the wirings, therefore, cannot be avoided to lower the efficiency in designing standard-cell type IC's in the prior art.

DETAILED DESCRIPTION OF THE PREFERRED EMBODIMENTS

Figure 2:
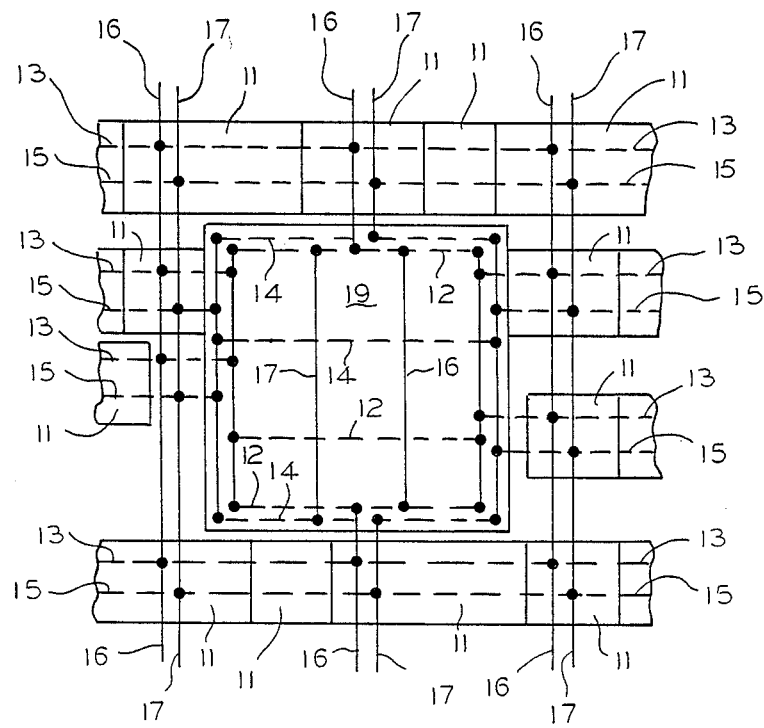
FIG. 2 is a schematic partial view of the first preferred embodiment according to the present invention.

A first preferrd embodiment according to the present invention having an improved structure of wirings for power supply is shownn in FIG. 2. A plurality of polycells 11 have the substantially same width (or height). A plural number of polycells 11 are arranged in a line to form a stripe having the substantially uniform width. A plural number of strips of the polycells 11 are disposed in parallel with one another. A megacell 19 having a width of about three times of the width of the polycell 11 is disposed in the parallel arrangement of the stripes of polycells 11. First level wirings 13 for power voltage $V_{DD}$ runs through the stripes of polycells at a predetermined level in the width. First level wirings 12 for power voltage $V_{DD}$ run along peripheries of the megacell 19 in parallel with the stripes of polycells 11 and through the megacell 19 at a one level in the width thereof. Similarly, first level wirings 15 in the polycells 11 and first level wirings 14 in the megacell 19 are formed in parallel with the first level wirings 12 and 13 for supplying power voltage $V_{SS}$ to the polycells 11 and the megacell 19. The first level wirings 12, 13, 14 and 15 directly contact with circuit element in a semiconductor chip and run thereon through an insulator film in a direction in parallel with the stripe of polycells 11.

Second level wirings 16 for supplying power voltage $V_{DD}$ run across the first level wirings 12 to 15 to connect with the first level wirings 12 and 13. Similarly, second level wiring 17 for supplying power voltage $V_{SS}$ run in parallel with the second level wirings 16 to connect with the first level wiring 14 and 15. On the megacell 19, the second level wirings 16 and 17 are disposed on peripheries thereof and on a region thereof in the direction perpendicular to the stripes of polycells 11. The second level wirings 16 and 17 respectively contact with the first level wirings 12 and 13 and the first level wirings 14 and 15 and run on an insulator film disposed on the above-mentioned insulator film on the semiconductor chip.

On the periphery of the megacell 19, the first level wirings 12 and 14 and the second level wirings 16 and 17 surround the circuit-element region of the megacell 19 and contact the second level wirings 16 and 17 on the stripes of polycells 11 and the first level wirings 13 and 15 on the stripes of polycells 11. Those connections are achieved by only extending the wirings 16, 17, 13 and 15 on the stripes of polycells 11. The softwave programing to achieve such connection is easy and is commonly applicable to megacells 19 having arbitrary dimension. Any manual correction is not required to obtain a high efficiency in designing standard-cell type IC's.

Figure 3:
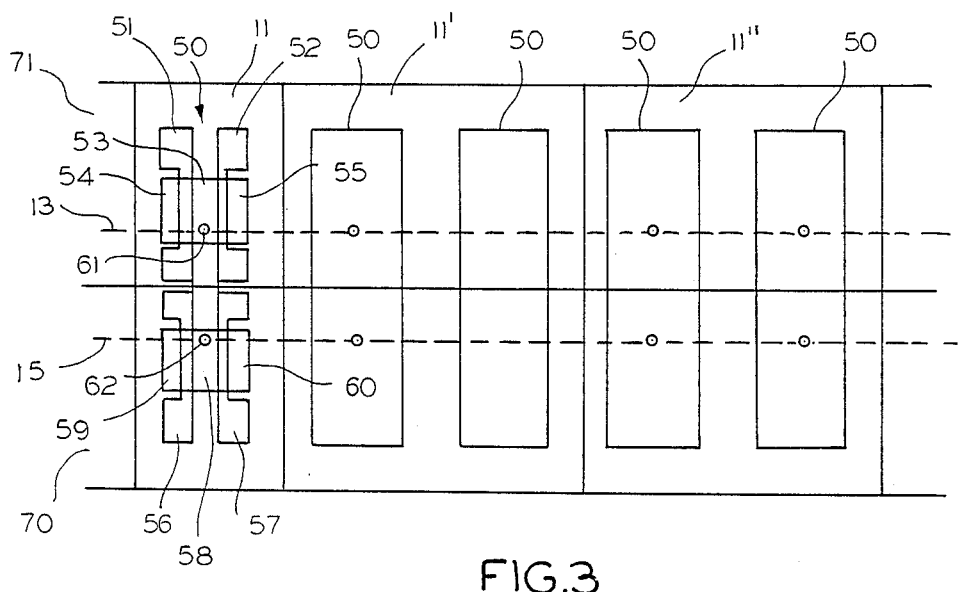
FIG. 3 is a schematic but more-detailed partial plan view of a part in the first preferred embodiment according to the present invention.

A stripe of polycells 11 is partially shown in FIG. 3. The polycells 11 respectively consist of one or more basic cell patterns 50. The cell pattern 50 includes two P-channel MOS FET's and two N-channel MOS FET's. A P-channel MOS FET is made of a gate electrode 51, a source region 53 and a drain region 54, the other being made of a gate electrode 52, a source region 53 and a drain region 55. An N-channel MOS FET is made of a gate electrode 56, a source region 58 and a drain region 59, the other being made of a gate electrode 57, a source region 58 and a drain region 60. The N-channel MOS FET's are formed in a P-type semiconductor substrate 70, the P-channel MOS FET's being formed in an N-type well-region 71 diffused in the semiconductor substrate 70. Those MOS FET's are wired to form a partial circuit of the standard-cell type IC with first level wirings running in parallel with the stripe of polycells 11 and second level wirings running in perpendicular to the stripe of polycells 11. The first level wirings directly contact with the source and drain regions, but the second level wirings contact with them through the first level wirings. To accomplish this structure, a lower insulator film, the first level wirings, an intermediate insulator film, the second level wirings and an upper insulator film are formed on the semiconductor substrate in this order. Those first and second level wirings also connect MOS FET's in different polycells 11 to form a whole circuit of a standard-cell type IC.

Figure 4:
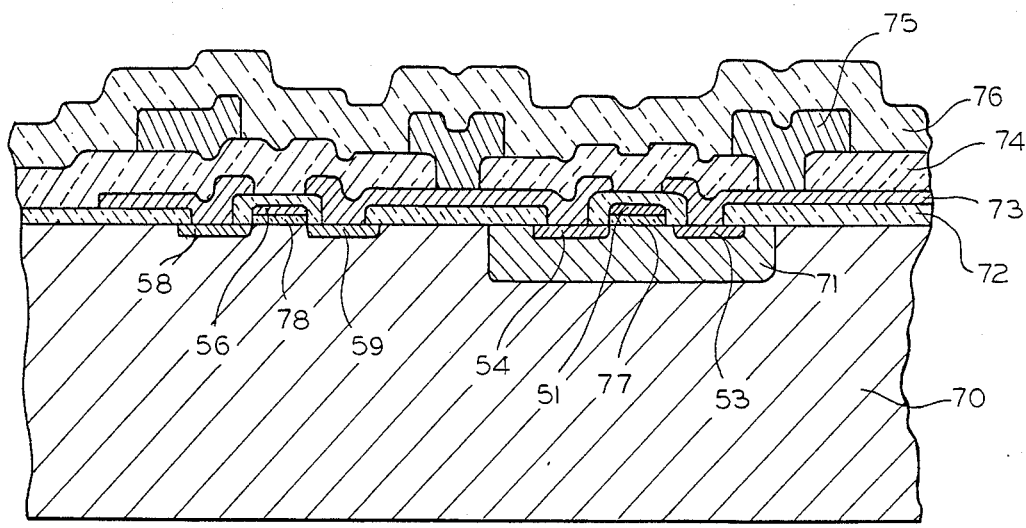
FIG. 4 is a sectional view for explaining a structure used in the first preferred embodiment according to the present invention.

Such structure is explanatory shown in FIG. 4 which is drawn only for explaining the concept of the structure and which data not correspond to any actual part of FIGS. 2 and 3. The N-type well region 71 is provided in the P-type substrate 70. P-type source and drain regions 53 and 54 are formed in the well-region 71. The gate electrode 51 is formed on a gate insluator film 77 disposed between the source and drain regions 53 and 54. N-type source and drain regions 58 and 59 are formed in the semi-conductor substrate 70. The gate electrode 56 is formed on a gate insulator film 78 disposed between the source and drain regions 58 and 59. The semiconductor substrate 70 and the N-well region 71 are covered with a phosphosilicate glass 72 having a thickness of 1 $\mu$m. The first level wirings 73 made of aluminum, for example, are evaporated on the phosphosilicate glass 72 and connected with the source and drain regions 53, 54, 58 and 59 through holes in the phosphosilicate glass 72. The thickness of the first level wirings 73 is 0.5 $\mu$m, for example. The first level wirings 73 runs in parallel with the stripe of polycells 11. A silicon oxide film 74 having a thickness of 1 $\mu$m covers the first level wirings 73. The second level wirings 75 having a thickness of 1 $\mu$m and made of aluminum, for example, are deposited on the silicon oxide film 74 and connected with the first level wirings 73 through holes in the silicon oxide film 74. The second level wirings 75 runs in perpendicular to the stripe of polycells 11. Silicon nitride film 76 having a thickness of 1 μm covers whole structure except for bonding pads (not shown) as a surface passivation film.

Figure 5:
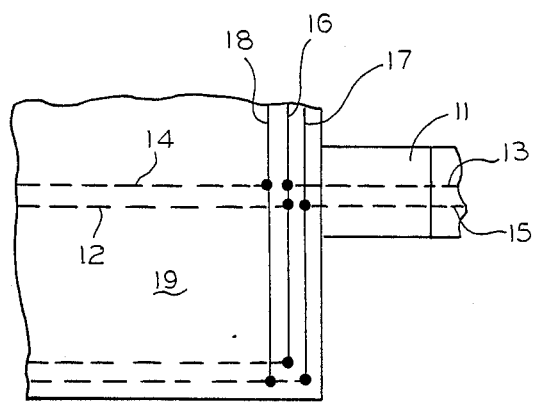
FIG. 5 is a schematic partial plan view of the second preferred embodiment according to the present invention.

FIG. 5 shows a peripheral portion of the megacell 19 according to the second preferred embodiment which is modified to improve the connection between wirings on the pheriphery of the megacell 19 and wirings on the polycell 11. This second embodiment has two first level wirings 12 and 14 for supplying power voltages $V_{DD}$ and $V_{SS}$ on the central part of the megacell 19. In accordance with position of the wirings 12 and 14, there happens a case where one or two of the wirings 12 and 14 forms straight lines with the first level wirings 13 and 14 on the polycells 11. When the wirings 12 for the power voltage $V_{DD}$ forms the straight line with the wirings 13 for the power voltage $V_{DD}$, the above-mentioned first embodiment has a possibility that any one of the wirings forming a straight line cannot be connected with the second level wirings 16 or 17 on the periphery of the megacell 19, because those wirings 12 to 15 are made of the same first level wirings.

The second preferred embodiment has additional second level wirings 18 to form three parallel wirings 16, 17 and 18 on the periphery of the megacell 19. The first level wiring 14 connects with the second level wiring 18. The first level wirings 12 and 13 connect with the second level wiring 16. The first level wirings 15 connects with the second level wiring 17. The second embodiment resolved the problem by the additional wiring 17 and requires no difficulty in the software program.

Figure 6:
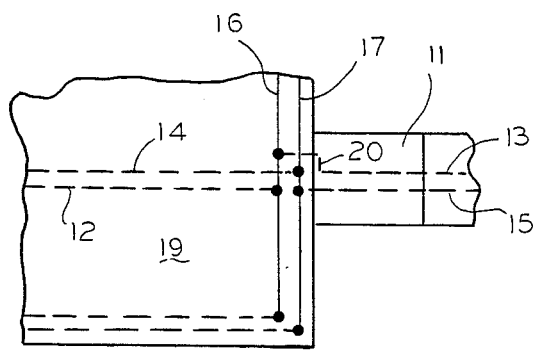
FIG. 6 is a schematic partial plan view of the third preferred embodiment according to the present invention.

The third preferred embodiment shown in FIG. 6 is another resolusion for the same problem. The first level wiring 13 turns perpendicularly by use of a second level wiring 20 and then connects with the second level wiring 16. This embodiment use only two second level wirings 16 and 17 on the periphery of the megacell 19 to save area.

While some preferred embodiments were explained hereinbefore, the present invention is not limited to those embodiments and many modifications may be applied to them. The present invention can be applicable to the gate-array IC in which macrocell has wirings for power supply on the periphery thereof, similarly to the megacell in the standard-cell type IC. Furthermore, the functions of the first and second level wirings for supplying power voltages may be interchanged. The first and second level wirings respectively have wirings for supplying a high power voltage and a low power voltage or a high or low power voltage and a grounding potential.

What is claimed is:

1. A semiconductor integrated circuit comprising:
a semiconductor chip;
a plurality of first groups of circuit elements formed on said semiconductor chip, said first groups of circuit elements being arranged in a plurality of lines, each circuit element in said first groups having first and second power supply wirings formed thereon in parallel with said lines for supplying a power voltage to said circuit elements in the same first group via circuit wirings, said first power supply wirings of said first groups on the same line being connected to each other to form a straight line, and said second power supply wirings of said first groups in the same line being connected to each other to form another straight line;
a second group of circuit elments formed at a predetermined area of said semiconductor chip; said area being surrounded by said first groups, one side of said area facing a plurality of said lines of said first groups, said second group having third and fourth power supply wirings formed on a peripheral portion of said area to surround said circuit elements of said second group, said third and fourth power supply wirings supplying said power voltage to said circuit elements of said second group via other circuit wirings; and
means formed on said semiconductor chip for extending said straight lines of said first and second power supply wirings beyond said first groups facing said side of said area to said third and fourth power supply wirings, respectively.

2. A semiconductor integrated circuit as claimed in claim 1, wherein said first groups of circuit elements are formed on areas of substantially the same width relative to a direction which is perpendicular to said lines, said first and second power supply wirings for supplying said first groups extending respectively through the same positions relative to said width and in parallel with said lines.

3. A semiconductor integrated circuit comprising:
a semiconductor chip;
a plurality of first groups of circuit elements formed on said semiconductor chip, said first groups of circuit elements being arranged in a plurality of lines, each circuit element in said first groups having first and second power supply wirings formed thereon in parallel with said lines for supplying a power voltage to said circuit elements in the same first group, said first power supply wirings of said first groups on the same line being connected to each other to form a straight line, and said second power supply wirings of said first groups in the same line being connected to each other to form another straight line;
a second group of circuit elements formed at a predetermined area of said semiconductor chip, one side of said area facing a plurality of said lines of said first groups, said second group having third and fourth power supply wirings formed on a peripheral portion of said area to surround said circuit elements of said second group, said third and fourth power supply wirings supplying said power voltage to said circuit elements of said second group;
means formed on said semiconductor chip for extending said straight lines of said first and second power supply wirings beyond said first groups facing said side of said area to said third and fourth power supply wirings, respectively;
a plurality of first internal power supply wirings formed in parallel with on another on an internal region of said second group of circuit elements which are surrounded by said peripheral portion with a connection to said third power supply wiring; and
a plurality of second internal power supply wiring; and in parallel with one another on said internal region of said second group with a connection to said fourth power supply wiring.

4. A semiconductor integrated circuit as claimed in claim 3, wherein said first internal power supply wiring are disposed orthogonally to said second internal power supply wirings.

5. A semiconductor integrated circuit as claimed in claim 1, further comprising a fifth power supply wiring formed on said semiconductor chip in said peripheral portion on said side of said area of said second group in parallel with said third and fourth power supply wirings, said fifth power supply wiring being connected with one of said third and fourth power supply wirings, a first internal power supply wiring formed on an internal region of said second group surrounded by said peripheral portion with a connection to said third power supply wiring, and a second internal power supply wiring formed on said internal region of said second group with a connection to said fourth power supply wiring, said straight line of said first power supply wirings being extended for connection with said fifth power supply wiring, and said other straight line of said second power supply wirings being extended for connection with said third power supply wiring.

6. A semiconductor integrated circuit as claimed in claim 5, wherein said first group has substantially a same width in a direction which is perpendicular to said lines, said first and second power supply wirings running on said first groups respectively through the same positions of said width in parallel with said lines.

* * * * *